US007583163B2

(12) United States Patent
Osone et al.

(10) Patent No.: US 7,583,163 B2
(45) Date of Patent: Sep. 1, 2009

(54) ACOUSTIC WAVE FILTER AND MANUFACTURING METHOD OF THE SAME

(75) Inventors: Yasuo Osone, Kasumigaura (JP); Chiko Yorita, Fujisawa (JP); Yuji Shirai, Hamura (JP); Seiichi Tomoi, Saku (JP)

(73) Assignee: Renesas Technology Corp., Tokyo (JP)

( * ) Notice: Subject to any disclaimer, the term of this patent is extended or adjusted under 35 U.S.C. 154(b) by 206 days.

(21) Appl. No.: 11/891,368

(22) Filed: Aug. 10, 2007

(65) Prior Publication Data

US 2008/0129412 A1 Jun. 5, 2008

(30) Foreign Application Priority Data

Sep. 27, 2006 (JP) .............................. 2006-262270

(51) Int. Cl.
*H03H 9/00* (2006.01)
*H03H 9/205* (2006.01)
*H01L 41/08* (2006.01)
(52) U.S. Cl. ........................................ 333/187; 333/189
(58) Field of Classification Search ................. 333/187, 333/188, 189, 190, 191, 192
See application file for complete search history.

(56) References Cited

U.S. PATENT DOCUMENTS 5,160,870 A * 11/1992 Carson et al. ............... 310/339
6,518,860 B2 * 2/2003 Ella et al. ................... 333/189
7,230,368 B2 * 6/2007 Lukacs et al. ............... 310/335

FOREIGN PATENT DOCUMENTS

JP 2002-268644 9/2002
JP 2002-268645 9/2002

* cited by examiner

*Primary Examiner*—Dean O Takaoka
(74) *Attorney, Agent, or Firm*—Townsend and Townsend and Crew LLP

(57) ABSTRACT

A technique capable of integrally forming SMR type acoustic wave filters corresponding to multiple bands on the same chip at low cost is provided. In SMR type acoustic wave filters including multiple bandpass filters corresponding to multiple bands formed over the same die (substrate), acoustic multilayer films are formed without or with a minimum number of masks and piezoelectric thin films having different thicknesses for respective bands are collectively formed. For example, after the acoustic multilayer films (low acoustic impedance layers and high acoustic impedance layers) are formed in a deep groove in a terrace paddy field shape over the die in a maskless manner, the piezoelectric thin films are c-axis-oriented and grown, and are polished by CMP method or the like to be adjusted in a thickness for respective bands, and therefore, the SMR type acoustic wave filters for multiple bands are formed over the same chip.

9 Claims, 3 Drawing Sheets

ACOUSTIC WAVE FILTER AND MANUFACTURING METHOD OF THE SAME

CROSS-REFERENCE TO RELATED APPLICATION

The present application claims priority from Japanese Patent Application No. JP 2006-262270 filed on Sep. 27, 2006, the content of which is hereby incorporated by reference into this application.

TECHNICAL FIELD OF THE INVENTION

The present invention relates to a technique for manufacturing an acoustic wave filter, and particularly to a technique effective when applied to a method of manufacturing a film bulk acoustic resonator (FBAR) type acoustic wave filter used as a bandpass filter in a transmit-receive circuit of a cellphone and the like and its structure.

BACKGROUND OF THE INVENTION

For example, as for an acoustic wave filter, a bulk acoustic wave filter such as a film bulk acoustic resonator (FBAR) filter and an SMR (solidly mounted resonator) type film bulk acoustic resonator filter (hereinafter called also SMR type acoustic wave filter), a surface acoustic wave filter such as a SAW (surface acoustic wave) filter and the like, are provided.

And, as a technique for forming multiple bulk acoustic wave filters over the same chip, a structure and a manufacturing method of a duplexer using FBAR are disclosed in, for example, Japanese Patent Application Laid-Open No. 2002-268644 (Patent Document 1) and Japanese Patent Application Laid-Open No. 2002-268645 (Patent Document 2).

SUMMARY OF THE INVENTION

An acoustic wave filter described above has been formed and sealed on a different chip for each signal band, and provided as a discrete module. These discrete modules are combined with another chip over an interconnection substrate by a cell-phone vendor or cell-phone transmit-receive circuit manufacturer to construct a radiofrequency telecommunication circuit.

However, because of development in the cell-phone such as downsizing, thinning and multi-function, an area occupied by the above radiofrequency telecommunication circuit tends to be reduced, for example, a need for built-in filters for multiple bands as one chip, not as discrete modules, to built into the radiofrequency telecommunication circuit, or for integral forming over a chip of a controller of the radiofrequency telecommunication circuit using a thin-film fabrication process is increasing.

On the other hand, as for improvement in the communication speed in the telecommunication system, the band to be used tends to increase. Although the SAW filter employed in a conventional cell-phone has been suitable for filtering a signal in a band near 900 MHz as in the second generation or the 2.5 generation cell-phone system, as the band increases in frequency, there is a problem that the filter characteristics are difficult to be improved, and therefore the FBAR filter and the SMR type acoustic wave filter that are the bulk acoustic wave filter have been developed in recent years.

In the case of the bulk acoustic wave filter, since a resonance frequency is determined based on a thickness of a piezoelectric thin film forming a filter, and eventually, a mask for forming a filter for each band is required in order to form filters corresponding to multiple bands on the same chip. Thus, there is a problem that the number of processes is increased and the yield ratio is reduced. Consequently, there is a problem that it is difficult to meet a requested specification in terms of cost.

Further, the SMR type acoustic wave filter has a configuration in which multiple pairs of films each of which composed of two kinds of films with different acoustic impedance and with a thickness of $\lambda/4$ are laminated alternately over a die or the same chip and the piezoelectric thin film is formed thereon for a wavelength $\lambda$ of a radiofrequency signal. FIG. 3 schematically shows a cross-sectional structure of the conventional SMR type acoustic wave filter. In the case of the SMR type acoustic wave filter, since thicknesses of an acoustic multilayer film and a piezoelectric thin film influence the filter characteristics, a mask for each band is required to be used in order to form the films on the same chip and the number of processes increases. And therefore there is a problem that a manufacturing cost is difficult to be reduced.

In FIG. 3, in the case where a first acoustic multilayer film in contact with a piezoelectric thin film 4 having a thickness of $\lambda/2$ via an upper electrode 2 and a bottom electrode 3 is set to a low acoustic impedance layer 5 with a thickness of $\lambda/4$ and a second acoustic multilayer film is set to a high acoustic impedance layer 6 with a thickness of $\lambda/4$, a structure in which the low acoustic impedance layer 5 and the high acoustic impedance layer 6 are alternately laminated for n layers is called as a $\lambda/2$-mode structure. And a resonator having a standing wave of $\lambda/2$ in the piezoelectric thin film 4 can be obtained.

Note that, in FIG. 3, on the contrary, if the first acoustic multilayer film is set to the high acoustic impedance layer, the second acoustic multilayer film is set to the low acoustic impedance layer and the thickness of the piezoelectric thin film is set to $\lambda/4$, a resonance having a standing wave of $\lambda/4$ occurs in the piezoelectric thin film. This is called as a $\lambda/4$-mode structure, and either of the mode structures may be selected in the present invention.

An object of the present invention is to provide a technique capable of solving the above problems and integrally forming the SMR type acoustic wave filters corresponding to multiple bands on the same chip at low cost.

The above and other objects and novel characteristics of the present invention will be apparent in the description and the accompanying drawings of the present specification.

An outline of typical elements of the invention disclosed in this application is described briefly as follows.

In the present invention, in order to achieve the above objects, in the SMR type acoustic wave filter having multiple bandpass filters corresponding to multiple bands formed over the same die, the acoustic multilayer film is formed without or with a minimum number of masks and the piezoelectric thin films having different thicknesses for each band are collectively formed.

Effect obtained by the typical elements of the invention disclosed in this application is described briefly as follows.

According to the present invention, by forming the acoustic multilayer film of the SMR type acoustic wave filter with a minimum number of masks and forming the piezoelectric thin films having multiple thicknesses collectively, the SMR type acoustic wave filters corresponding to multiple bands can be formed integrally over the same chip at low cost.

BRIEF DESCRIPTIONS OF THE DRAWINGS

DESCRIPTIONS OF THE PREFERRED EMBODIMENTS

Embodiments of the present invention will be described below in detail with reference to the drawings. Note that, in all drawings for explaining the embodiments, the same members are provided with the same reference symbols, in principle, and repeated explanation of such members is omitted.

First Embodiment

Figure 1:
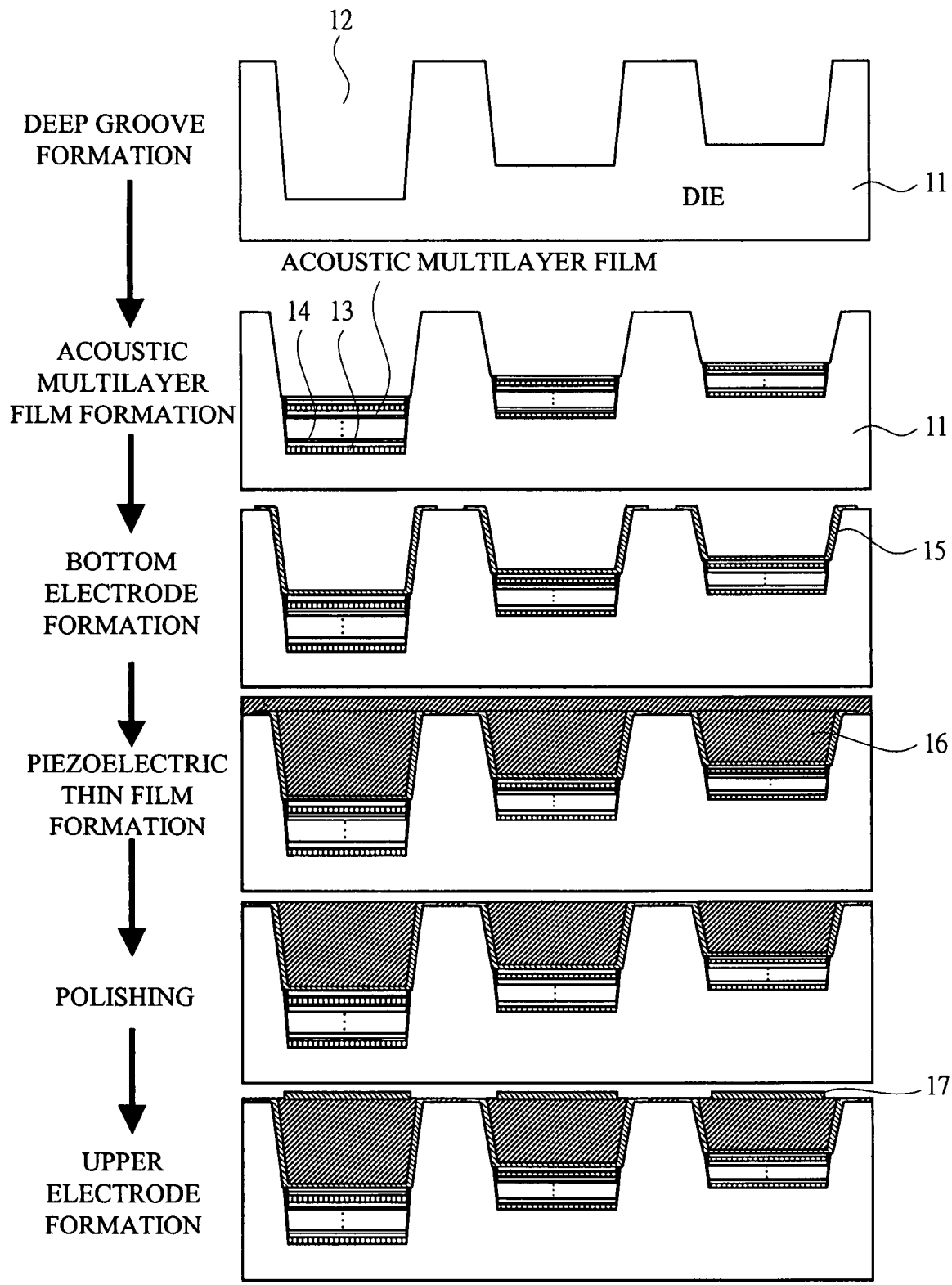
FIG. 1 is a diagram showing a film forming process and cross-sectional structures of SMR type acoustic wave filters according to a first embodiment of the present invention.

A first embodiment of the present invention will be described using FIG. 1. FIG. 1 is a cross-sectional diagram showing a manufacturing method and structures of SMR type acoustic wave filters according to the present embodiment.

In FIG. 1, firstly, in a deep groove formation process, deep grooves 12 having a shape similar to a terrace paddy field with different depths are formed over a die (a substrate, a wafer or a chip) 11 by etching using masks corresponding to the number of bands. The etching method may be wet etching or dry etching. Note that, FIG. 1 shows a case of forming a filters corresponding to three kinds of bands, but the embodiment is not limited thereto.

Next, in an acoustic multilayer film formation process, an acoustic multilayer film in which low acoustic impedance layers 13 and high acoustic impedance layers 14 are alternately laminated is formed in each deep groove 12 through a maskless method, for example, inkjet. In the case of the inkjet, although there are some objects in process accuracy for forming a fine interconnection shape and semiconductor device electrode, it is relatively easy to form a thin film having a relatively large area such as the acoustic multilayer film at a constant thickness. For material of the high acoustic impedance film 14, molybdenum (Mo), tungsten (W), aluminum nitride, zinc oxide and the like can be considered and for material of the low acoustic impedance film 13, $SiO_2$ and the like can be considered. Note that, in FIG. 1, an example of the $\lambda/2$-mode structure is employed, the first layer is set to the low acoustic impedance layer 13 and the second layer is set to the high acoustic impedance layer 14, but, needless to say, the structure is reversed in the case of the $\lambda/4$-mode structure.

Further, in a bottom electrodes formation process, bottom electrodes 15 which extend from above the acoustic multilayer film in each groove 12 to inner periphery part of the deep groove and surrounding portion thereof are formed. In doing so, the remaining depth of each groove 12 is desirably controlled to be $\lambda/2$ (or $\lambda/4$) of each band or slightly shallower than $\lambda/2$ (or $\lambda/4$).

Subsequently, in a piezoelectric thin film formation process, the piezoelectric thin film 16 is subjected to growth of c-axis in a cross-plane direction over the bottom electrode 15 in each deep groove 12. In consideration of subsequent film thinning, the thickness may be any value only if it is enough to obtain a flat surface in polishing. As the piezoelectric thin film 16, zinc oxide (ZnO), aluminum nitride (AlN) and the like may be used, and ferroelectric strongly-coupled piezo-electric materials or the like can be used also.

Furthermore, in a polishing process, after the piezoelectric thin film 16 is formed, the surface of the piezoelectric thin film 16 is polished and the thickness thereof is thinned to be $\lambda/2$ (or $\lambda/4$) for each band. As a method of polishing the surface, for example, a method such as a chemical mechanical polishing (CMP) may be used, but other method can be employed. At this stage, the surface position of the piezoelectric thin film 16 is substantially in the in-plane irrespective of used band.

Finally, in an upper electrodes formation process, upper electrodes 17 are formed over the top surfaces of the piezoelectric thin films 16 and the interconnection are made so that the acoustic wave filters corresponding to multiple bands can be collectively formed over the same chip.

With the manufacturing method described above, the SMR type acoustic wave filters having the deep grooves 12 formed over the same die 11, the acoustic multilayer film made of the low acoustic impedance layers 13 and the high acoustic impedance layers 14 formed in each of the deep grooves 12, the bottom electrodes 15 formed over the respective top surfaces of the acoustic multilayer film, the piezoelectric thin films 16 formed over the respective top surfaces of the bottom electrodes 15, and the upper electrodes 17 formed over the respective top surfaces of the piezoelectric thin films 16 can be obtained.

Therefore, with the present embodiment, it is possible to carry out the thin film processes without mask except in forming the deep grooves 12 in the terrace paddy field shape and in forming the bottom electrode 15 and the upper electrodes 17, and therefore, a significant reduction of the number of masks and cost cutting due to the reduction can be achieved.

Second Embodiment

Figure 2:
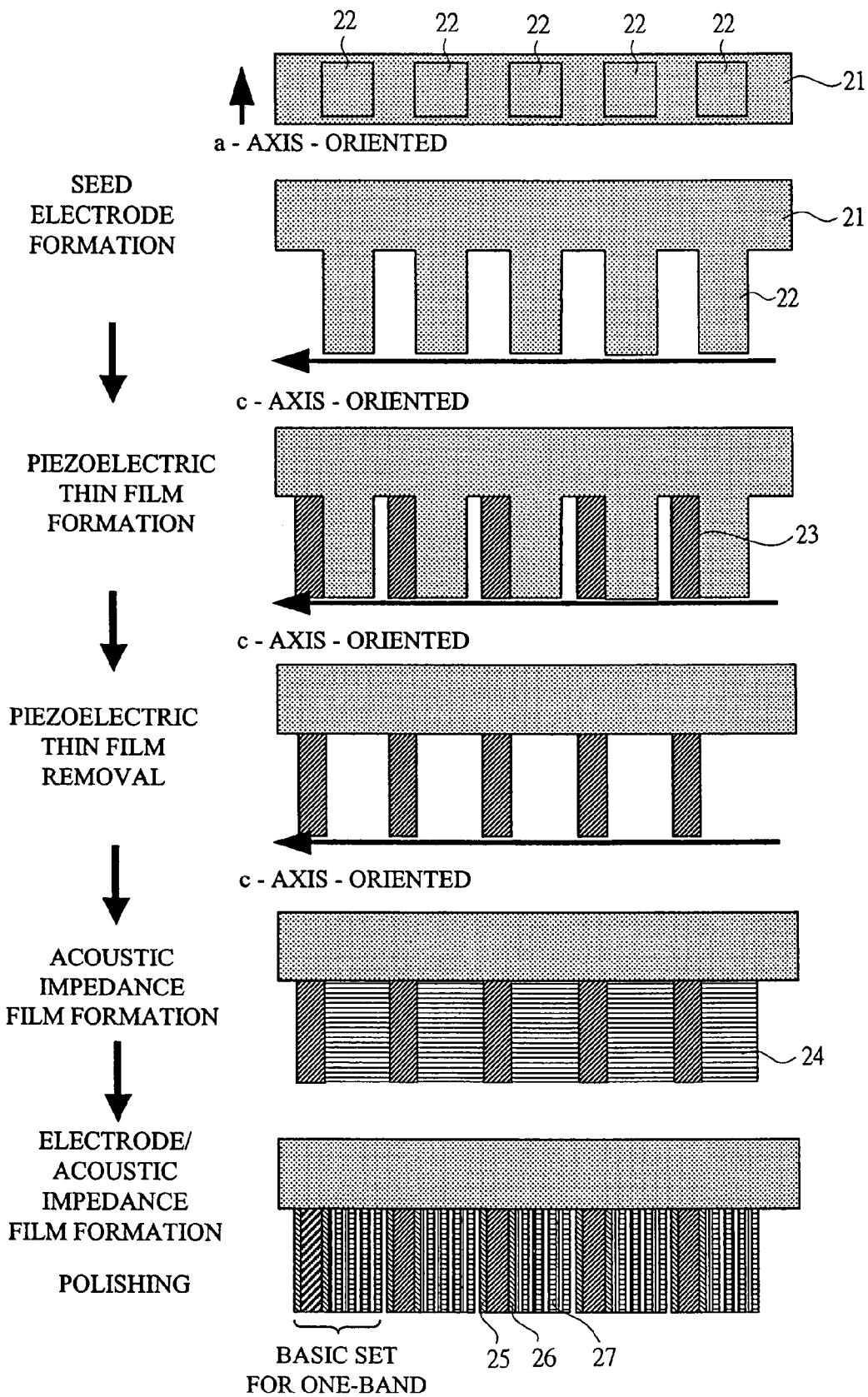
FIG. 2 is a diagram showing a film forming process and cross-sectional structures of SMR type acoustic wave filters according to a second embodiment of the present invention.
Figure 3:
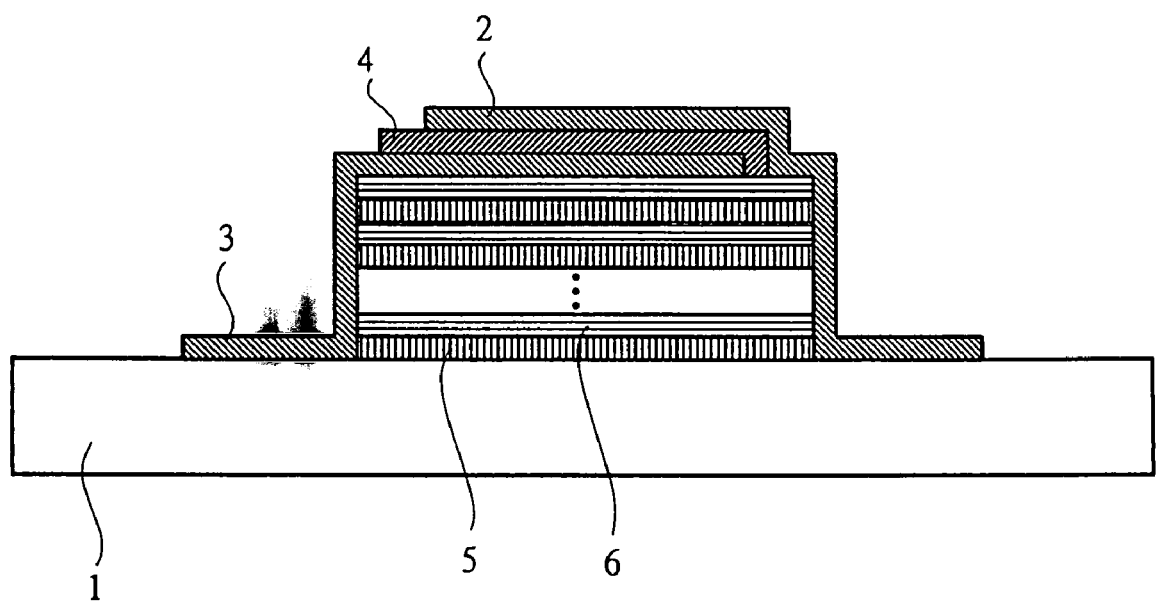
FIG. 3 is a diagram showing a cross-sectional structure of a conventional SMR type acoustic wave filter.

A second embodiment of the present invention will be described using FIG. 2. FIG. 2 is a cross-sectional diagram showing a manufacturing method and structures of SMR type acoustic wave filters according to the present embodiment.

In the bulk acoustic wave filter such as the SMR type acoustic wave filter, the piezoelectric thin film is c-axis-oriented in a direction of acoustic wave resonating, that is in a cross-plane direction. Since the piezoelectric thin film and a thickness of the acoustic multilayer film formed therebelow have control over the characteristics of the filter, a control of the thickness is an important object.

On the other hand, if the piezoelectric thin film with c-axis-oriented in a in-plane direction can be formed over a die or a wafer, a filter structure in which the conventional bulk acoustic wave filter is laterally rotated by 90 degrees can be formed with small number of masks and processes.

In the present embodiment, as shown in FIG. 2, at first, in a seed electrode formation process, a structural body to be a seed electrode 22 for forming the piezoelectric thin film as a film with c-axis-oriented in the in-plane direction and a-with axis-oriented in the cross-plane direction is formed over a die (a substrate, a wafer or a chip) 21. For example, a shape of a cantilever may be employed.

Next, in a piezoelectric thin film formation process, a piezoelectric thin films 23 with c-axis-oriented in the in-plane direction from the seed electrode 22 are subjected to crystal growth. Since the piezoelectric thin films 23 need to be grown under a condition in which a thickness is different for each used band, the processes may be divided for each of the band or a method in which the piezoelectric thin films having the same thickness are formed once and the thicknesses are adjusted in the next seed electrode removal process may be employed.

Further, in a seed electrode removal process, after completion of forming of the piezoelectric thin films 23, the seed electrode 22 is removed through etching. Since a control of the thicknesses of the piezoelectric thin films 23 is important, it is desirable to remove the seed electrode 22 through dry etching. In so doing, etching may be performed also to the piezoelectric thin films 23 such that the thickness of each of the piezoelectric thin films 23 are at a predetermined value for each band as described above.

Subsequently, in an acoustic impedance film formation process, after the removal of the seed electrode 22, one acoustic impedance film supposed to be an acoustic multilayer film is formed to be contact with the piezoelectric thin film. Here, the low acoustic impedance film 24 is formed as an example of the λ/2-mode structure. Note that, in the case of the λ/4-mode structure, the high acoustic impedance film is formed.

Furthermore, in an electrode/acoustic impedance film formation process, the low acoustic impedance film 24 is etched by dry etching such that the low acoustic impedance film 24 are discretely arranged by λ/4 in the thickness using a portion contacting to the piezoelectric thin film 23 as reference portion. And the upper electrode 25, the bottom electrode 26 and another one high acoustic impedance film 27 supposed to be the acoustic multilayer film are grown in the resulting groove part having a high aspect ratio.

Finally, in a polishing process, by polishing and removing the upper electrode 25, the bottom electrode 26 and the high acoustic impedance film 27 which are beyond the groove, the bulk acoustic wave filters can be collectively formed over the wafer or the chip to be inclined at substantially 90 degrees relative to a conventional structure. A thickness of the acoustic impedance film can be substantially controlled by one mask at the etching for forming the acoustic impedance film of latter, and it is not necessary to divide the masks and processes for each band.

With the above described manufacturing method, the SMR type acoustic wave filters having the structural bodies made of the piezoelectric thin film 23 with c-axis-oriented in the in-plane direction and with a-axis-oriented in the cross-plane direction on the same die 21, the upper electrode 25 and the bottom electrode 26 formed to sandwich each of the structural bodies in the in-plane direction, and the acoustic multilayer film made of the low acoustic impedance film 24 and the high acoustic impedance film 27 formed on a side of the bottom electrode 26 can be obtained.

Note that, in the structure of the present embodiment, it is possible to form the acoustic wave filter having the structural bodies made of the piezoelectric thin film 23 and the upper electrode 25 and bottom electrode 26 formed to sandwich each of the structural bodies by using a space instead of the acoustic multilayer film. Further, the acoustic multilayer film may be formed on a side of the upper electrode 25.

As described above, according to the first embodiment and second embodiment of the present invention, it is possible to reduce the number of masks and processes in the conventional acoustic multilayer film forming and to form the bulk acoustic wave filter structures collectively over the wafer or the same chip. Consequently, it is possible for the bulk acoustic wave filters which have been formed over different chips to be arranged in parallel over the interconnection substrate in order to avoid high cost conventionally to be integrated at low cost and collectively formed in a minute area. And therefore, by forming the filters over the semiconductor device for the radiofrequency telecommunication circuit or arranging laterally in parallel arrangement over the same chip as the semiconductor device, the filter structure made in one chip with the semiconductor device can be provided. As a result, low cost due to reduction in footprint and improvement in circuit characteristics due to large reduction of wiring distance in the interconnection layer can be achieved.

Although the present invention made by the present inventor has been specifically described with reference to the embodiments, the present invention is not limited to the above embodiments, and may be variously modified without departing from the spirit thereof.

The manufacturing technique of the acoustic wave filter according to the present invention is applicable to a manufacturing method and a structure of the SMR type acoustic wave filter used as a bandpass filter in the transmit-receive circuit of a cell-phone.

What is claimed is:

1. An acoustic wave filter including multiple bandpass filters (BPF) formed over the same substrate corresponding to multiple bands, comprising:
    multiple grooves formed over the same substrate having different depth;
    acoustic multilayer films having different thicknesses for respective bands formed in the grooves respectively;
    first electrodes formed over respective top surfaces of the acoustic multilayer films;
    piezoelectric thin films formed over respective top surfaces of the first electrodes; and
    second electrodes formed over respective top surfaces of the piezoelectric thin films.

2. A method of manufacturing an acoustic wave filter including multiple bandpass filters formed over the same substrate corresponding to multiple bands, comprising:
    a process of forming multiple grooves having different depth over the same substrate;
    a process of forming acoustic multilayer films having different thicknesses for respective bands in the grooves respectively;
    a process of forming first electrodes over respective top surfaces of the acoustic multilayer films;
    a process of forming piezoelectric thin films over respective top surfaces of the first electrodes; and
    a process of forming second electrodes over respective top surfaces of the piezoelectric thin films.

3. The method of manufacturing an acoustic wave filter according to claim 2,
    wherein distances between the top surfaces of the piezoelectric thin films and a bottom surface of the substrate are equal and distances between bottom surfaces of the piezoelectric thin films and the bottom surface of the substrate are different for respective bands.

4. The method of manufacturing an acoustic wave filter according to claim 2,
    wherein the acoustic multilayer films are formed by inkjet.

5. The method of manufacturing an acoustic wave filter according to claim 2,
    wherein after the piezoelectric thin films are subjected to growth of c-axis in a cross-plane direction from inside of the groove and polished to a predetermined thickness from the side of the top surface, the second electrodes are formed.

6. An acoustic wave filter including multiple bandpass filters formed over the same substrate corresponding to multiple bands, comprising:

multiple piezoelectric thin film structural bodies formed with c-axis-oriented in an in-plane direction and with a-axis-oriented in an cross-plane direction of the same substrate and having different thicknesses corresponding to bands; and first and second electrodes formed to sandwich each of the piezoelectric thin film structural bodies in the in-plane direction.

7. The acoustic wave filter according to claim 6, further comprising: acoustic multilayer films having different thicknesses for respective bands formed to be contact with at least one of the first and second electrodes.

8. A method of manufacturing an acoustic wave filter including multiple bandpass filters corresponding to multiple bands formed over the same substrate, comprising:

a process of forming multiple piezoelectric thin film structural bodies with c-axis-oriented in an in-plane direction and with a-axis-oriented in an cross-plane direction of the same substrate having different thicknesses corresponding to bands; and a process of forming first and second electrodes so as to sandwich each of the piezoelectric thin film structural bodies in the in-plane direction.

9. The method of manufacturing an acoustic wave filter according to claim 8, further comprising: a process of forming acoustic multilayer films having different thicknesses for respective used bands in contact with at least one of the first and second electrodes.

* * * * *